United States Patent
Chen et al.

(10) Patent No.: US 9,865,464 B2
(45) Date of Patent: *Jan. 9, 2018

(54) NANOCRYSTALLINE DIAMOND CARBON FILM FOR 3D NAND HARDMASK APPLICATION

(71) Applicant: Applied Materials, Inc., Santa Clara, CA (US)

(72) Inventors: Yongmei Chen, San Jose, CA (US); Christopher S. Ngai, Burlingame, CA (US); Jingjing Liu, Milpitas, CA (US); Jun Xue, San Jose, CA (US); Chentsau Ying, Cupertino, CA (US); Ludovic Godet, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/348,170

(22) Filed: Nov. 10, 2016

(65) Prior Publication Data

US 2017/0062216 A1 Mar. 2, 2017

Related U.S. Application Data

(63) Continuation of application No. 14/833,858, filed on Aug. 24, 2015, now Pat. No. 9,502,262.
(Continued)

(51) Int. Cl.
*H01L 21/033* (2006.01)
*H01L 29/49* (2006.01)
(Continued)

(52) U.S. Cl.
CPC ......... *H01L 21/0332* (2013.01); *C23C 16/27* (2013.01); *H01L 21/02115* (2013.01);
(Continued)

(58) Field of Classification Search
CPC ........... H01L 21/0332; H01L 21/02115; H01L 21/02274; H01L 21/0335; H01L 21/0337;
(Continued)

(56) References Cited

U.S. PATENT DOCUMENTS 6,673,684 B1 * 1/2004 Huang ............. H01L 21/32139
257/E21.314
6,811,612 B2 11/2004 Gruen et al.
(Continued)

FOREIGN PATENT DOCUMENTS

| JP | H4-257232 A | 9/1992 |
|---|---|---|
| JP | 2004-111704 A | 4/2004 |
| JP | 2005-039082 A | 2/2005 |

OTHER PUBLICATIONS

M. F. Ravet, et al.; Realization of X-Ray Lithography Masks Based on Diamond Membranes; Materials Research Society Symposium Proceedings; vol. 306; dated 1993; pp. 103-109.
(Continued)

Primary Examiner — Karen Kusumakar
(74) Attorney, Agent, or Firm — Patterson + Sheridan, LLP

(57) ABSTRACT

A nanocrystalline diamond layer for use in forming a semiconductor device and methods for using the same are disclosed herein. The device can include a substrate with a processing surface and a supporting surface, a device layer formed on the processing surface and a nanocrystalline diamond layer formed on the processing layer, the nanocrystalline diamond layer having an average grain size of between 2 nm and 5 nm. The method can include positioning a substrate in a process chamber, depositing a device layer on a processing surface, depositing a nanocrystalline diamond layer on the device layer, the nanocrystalline diamond layer having an average grain size of between 2 nm and 5 nm, patterning and etching the nanocrystalline diamond
(Continued)

layer, etching the device layer to form a feature and ashing the nanocrystalline diamond layer from the surface of the device layer.

20 Claims, 3 Drawing Sheets

Related U.S. Application Data

(60) Provisional application No. 62/045,196, filed on Sep. 3, 2014.

(51) Int. Cl.
| | |
|---|---|
| H01L 27/115 | (2017.01) |
| H01L 27/11556 | (2017.01) |
| H01L 27/11582 | (2017.01) |
| H01L 29/51 | (2006.01) |
| H01L 21/02 | (2006.01) |
| H01L 21/311 | (2006.01) |
| C23C 16/27 | (2006.01) |
| H01L 27/11524 | (2017.01) |
| H01L 27/1157 | (2017.01) |

(52) U.S. Cl.
CPC .... *H01L 21/02274* (2013.01); *H01L 21/0335* (2013.01); *H01L 21/0337* (2013.01); *H01L 21/31111* (2013.01); *H01L 21/31122* (2013.01); *H01L 21/31144* (2013.01); *H01L 27/1157* (2013.01); *H01L 27/11524* (2013.01); *H01L 27/11556* (2013.01); *H01L 27/11582* (2013.01); *H01L 29/49* (2013.01); *H01L 29/495* (2013.01); *H01L 29/4966* (2013.01); *H01L 29/4975* (2013.01); *H01L 29/51* (2013.01); *H01L 29/518* (2013.01)

(58) Field of Classification Search
CPC ......... H01L 21/31111; H01L 21/31122; H01L 21/31144; H01L 27/11524; H01L 27/11556; H01L 27/1157; H01L 27/11582; H01L 29/49; H01L 29/495; H01L 29/4966; C23C 16/27
See application file for complete search history.

(56) References Cited

U.S. PATENT DOCUMENTS

| | | |
|---|---|---|
| 2005/0042161 A1 | 2/2005 | Carlisle et al. |
| 2006/0060864 A1 | 3/2006 | Gerbi |
| 2009/0091037 A1 | 4/2009 | Assefa et al. |
| 2010/0052112 A1 | 3/2010 | Rogers et al. |
| 2010/0084634 A1 | 4/2010 | Gamo et al. |
| 2010/0209665 A1* | 8/2010 | Konovalov ............ B82Y 30/00 428/141 |
| 2011/0266611 A1* | 11/2011 | Kim .................. H01L 21/28273 257/324 |
| 2013/0175546 A1 | 7/2013 | Khan |

OTHER PUBLICATIONS

PCT Notification of Transmittal of the International Search Report and the Written Opinion of the International Searching Authority for International Application No. PCT/US2015/046713 dated Jan. 15, 2016; 13 total pages.

Angadi, et al.; Journal of Applied Physics; Thermal Transport and Grain Boundary Conductance in Ultrananocrystalline Diamond Thin Films; dated 2006; 6 total pages.

Japanese Office Action (with attached English translation) for Application No. 2017-512789; dated Jul. 19, 2017; 7 total pages.

* cited by examiner

NANOCRYSTALLINE DIAMOND CARBON FILM FOR 3D NAND HARDMASK APPLICATION

CROSS-REFERENCE TO RELATED APPLICATIONS

This application is a continuation application of co-pending U.S. patent application Ser. No. 14/833,858, filed on Aug. 24, 2015, which claims benefit of U.S. Provisional Patent Application Ser. No. 62/045,196, filed on Sep. 3, 2014. Each of afore mentioned patent application are incorporated herein by reference.

BACKGROUND

Field

Embodiments disclosed herein generally relate to devices comprising inert carbon films. More specifically, embodiments generally relate to nanocrystalline diamond films.

Description of the Related Art

As the semiconductor industry introduces new generations of integrated circuits (IC's) having higher performance and greater functionality, the density of the elements that form those IC's is increased, while the dimensions, size and spacing between the individual components or elements are reduced. While in the past such reductions were limited only by the ability to define the structures using photolithography, device geometries having dimensions measured in um or nm have created new limiting factors, such as the conductivity of the metallic elements, the dielectric constant of the insulating material(s) used between the elements or challenges in 3D NAND or DRAM processes. These limitations may be benefited by more durable and higher hardness hardmasks.

A thick carbon hardmask is well known and commonly used as POR film. However, current carbon hardmask compositions are expected to be insufficient as DRAM and NAND continue their scaling down to under ~10 nm regime. This downscaling will require even higher aspect ratio deep contact hole or trench etch. The high aspect ratio etch issues include clogging, hole-shape distortion, and pattern deformation, top critical dimension blow up, line bending, profile bowing are generally observed in these applications. Many etch challenges are dependent on the hardmask material property. Deep contact hole deformation is due to hardmask lower density and poor thermal conductivity. Slit pattern deformation or line bending is due to hardmask material lower selectivity and stress. So, it is desirable to have an etch hardmask with higher density, higher etch selectivity, lower stress and excellent thermal conductivity.

Nanocrystalline diamond is known as a high hardness material. Nanocrystaline diamond materials, owing to their unusual properties such as extreme hardness, chemical inertness, and high thermal conductivity, can be used for wear-resistive coatings, optical windows, surface acoustic-wave devices, and heat spreaders. However, nanocrystalline diamond films have not been applied to the semiconductor manufacture processes.

Therefore, there is a need for higher hardness films for semiconductor devices.

SUMMARY

Embodiments disclosed herein generally relate to nanocrystalline diamond layers. By controlling the grain size to between 2 and 5 nm, nanocrystalline diamond films may be utilized in connection with semiconductor devices. These nanocrystalline diamond films may be used in a variety of applications, such as the nanocrystalline diamond layer acting as a hardmask during etch processes. In one embodiment, a device can include a substrate with a processing surface and a supporting surface; a device layer formed on the processing surface; and a nanocrystalline diamond layer formed on the processing layer, the nanocrystalline diamond layer having an average grain size of between 2 nm and 5 nm.

In another embodiment, a method for processing a substrate can include positioning a substrate in a process chamber, the substrate having a processing surface and a supporting surface; depositing a device layer on the processing surface; depositing a nanocrystalline diamond layer on the device layer, the nanocrystalline diamond layer having an average grain size of between 2 nm and 5 nm; patterning the nanocrystalline diamond layer; etching the device layer to form a feature; and removing any remaining nanocrystalline diamond layer from the surface of the device layer.

In another embodiment, a device can include a substrate with a processing surface and a supporting surface; a plurality of device layers formed on the processing surface, the device layer forming one or more components of a 3D NAND structure; a plurality of channels formed through the device layer, each of the plurality of channels connecting to at least one of the one or more components; and a nanocrystalline diamond layer formed on the processing layer, the nanocrystalline diamond layer having an average grain size of between 2 nm and 5 nm.

BRIEF DESCRIPTION OF THE DRAWINGS

So that the manner in which the above recited features of the present embodiments can be understood in detail, a more particular description of the embodiments, briefly summarized above, may be had by reference to embodiments, some of which are illustrated in the appended drawings. It is to be noted, however, that the appended drawings illustrate only typical embodiments and are therefore not to be considered limiting of its scope.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments disclosed herein generally relate to a nanocrystalline diamond layer formed on a substrate. Nanocrystalline diamond layers provide higher density, higher etch selectivity, lower stress and excellent thermal conductivity needed for processing features in a substrate below the 10 nm boundary. Embodiments are more clearly described with reference to the figures below.

Figure 1:
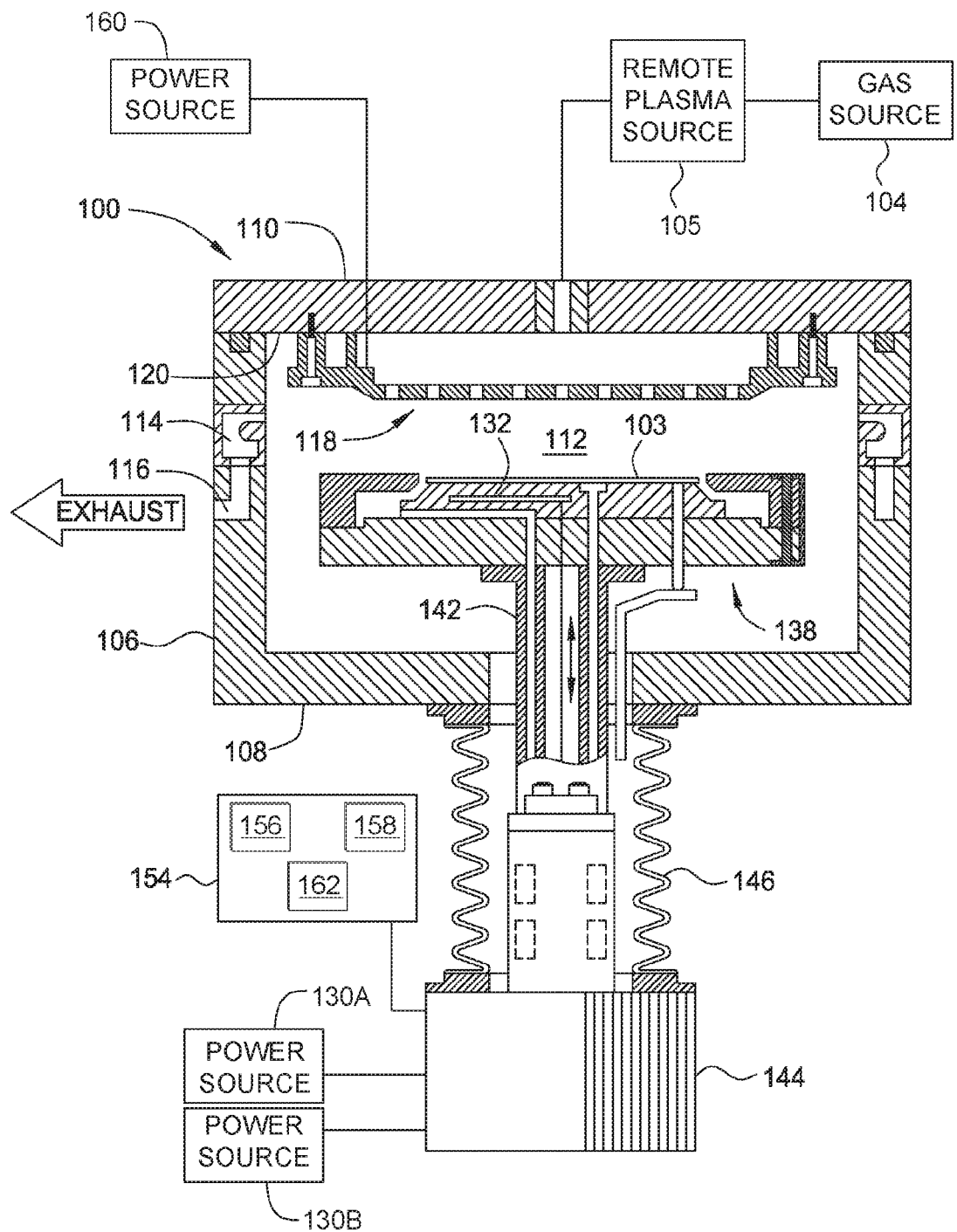
FIG. 1 is a schematic cross-sectional view of a CVD process chamber configured, according to one or more embodiments.

FIG. 1 is a schematic cross-sectional view of a CVD process chamber 100 that may be used for depositing a carbon based layer according to the embodiments described herein. A process chamber that may be adapted to perform the carbon layer deposition methods described herein is the PRODUCER® chemical vapor deposition chamber, available from Applied Materials, Inc. located in Santa Clara, Calif. It is to be understood that the chamber described below is an exemplary chamber and other chambers, including chambers from other manufacturers, may be used with or modified to accomplish aspects of the present disclosure.

The process chamber 100 may be part of a processing system (not shown) that includes multiple process chambers connected to a central transfer chamber (not shown) and serviced by a robot (not shown). The process chamber 100 includes walls 106, a bottom 108, and a lid 110 that define a process volume 112. The walls 106 and bottom 108 can be fabricated from a unitary block of aluminum. The process chamber 100 may also include a pumping ring 114 that fluidly couples the process volume 112 to an exhaust port 116 as well as other pumping components (not shown).

A substrate support assembly 138, which may be heated, may be centrally disposed within the process chamber 100. The substrate support assembly 138 supports a substrate 103 during a deposition process. The substrate support assembly 138 generally is fabricated from aluminum, ceramic or a combination of aluminum and ceramic, and includes at least one bias electrode 132.

A vacuum port may be used to apply a vacuum between the substrate 103 and the substrate support assembly 138 to secure the substrate 103 to the substrate support assembly 138 during the deposition process. The bias electrode 132 may be, for example, disposed in the substrate support assembly 138, and coupled to a bias power source 130A and 130B, to bias the substrate support assembly 138 and substrate 103 positioned thereon to a predetermined bias power level while processing.

The bias power source 130A and 130B can be independently configured to deliver power to the substrate 103 and the substrate support assembly 138 at a variety of frequencies, such as a frequency between about 1 and about 60 MHz. Various permutations of the frequencies described here can be employed without diverging from the embodiments described herein.

Generally, the substrate support assembly 138 is coupled to a stem 142. The stem 142 provides a conduit for electrical leads, vacuum and gas supply lines between the substrate support assembly 138 and other components of the process chamber 100. Additionally, the stem 142 couples the substrate support assembly 138 to a lift system 144 that moves the substrate support assembly 138 between an elevated position (as shown in FIG. 1) and a lowered position (not shown) to facilitate robotic transfer. The bellows 146 provides a vacuum seal between the process volume 112 and the atmosphere outside the process chamber 100 while facilitating the movement of the substrate support assembly 138.

The showerhead 118 may generally be coupled to an interior side 120 of the lid 110. Gases (i.e., process gases and other gases) that enter the process chamber 100 pass through the showerhead 118 and into the process chamber 100. The showerhead 118 may be configured to provide a uniform flow of gases to the process chamber 100. Uniform gas flow is desirable to promote uniform layer formation on the substrate 103. A remote plasma source 105 including a gas source 104 can be coupled with the process volume 112. Shown here, a remote activation source, such as a remote plasma generator, is used to generate a plasma of reactive species which are then delivered into the process volume 112. Exemplary remote plasma generators are available from vendors such as MKS Instruments, Inc. and Advanced Energy Industries, Inc.

Additionally, a plasma power source 160 may be coupled to the showerhead 118 to energize the gases through the showerhead 118 towards substrate 103 disposed on the substrate support assembly 138. The plasma power source 160 may provide RF power.

The function of the process chamber 100 can be controlled by a computing device 154. The computing device 154 may be one of any form of general purpose computer that can be used in an industrial setting for controlling various chambers and sub-processors. The computing device 154 includes a computer processor 156 and memory 158. The memory 158 may include any suitable memory, such as random access memory, read only memory, flash memory, hard disk, or any other form of digital storage, local or remote. The computing device 154 may include various support circuits 162, which may be coupled to the computer processor 156 for supporting the computer processor 156 in a conventional manner. Software routines, as required, may be stored in the memory 158 or executed by a second computing device (not shown) that is remotely located.

The computing device 154 may further include one or more computer readable media (not shown). Computer readable media generally includes any device, located either locally or remotely, which is capable of storing information that is retrievable by a computing device. Examples of computer readable media useable with embodiments described herein include solid state memory, floppy disks, internal or external hard drives, and optical memory (e.g., CDs, DVDs, BR-D, etc). In one embodiment, the memory 158 may be the computer readable media. Software routines may be stored on the computer readable media to be executed by the computing device.

The software routines, when executed, transform the general purpose computer into a specific process computer that controls the chamber operation so that a chamber process is performed. Alternatively, the software routines may be performed in hardware as an application specific integrated circuit or other type of hardware implementation, or a combination of software and hardware.

Figure 2:
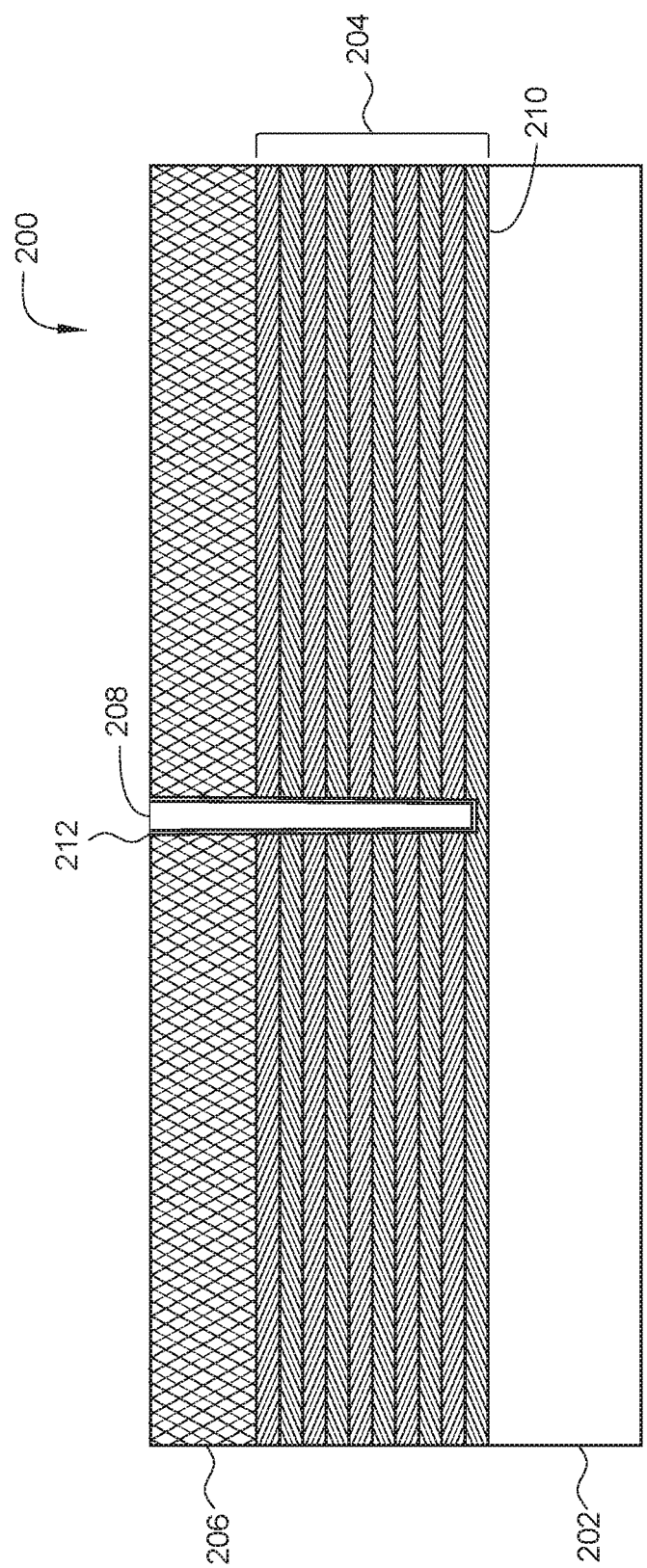
FIG. 2 is a side view of a nanocrystalline diamond layer, according to one or more embodiments.

FIG. 2 is a device 200 with a nanocrystalline diamond layer formed thereon, according to one embodiment in which the device 200 is a NAND device. The device 200 includes a substrate 202, a plurality of device layers 204 and a nanocrystalline diamond layer 206.

The substrate 202 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as silicon oxide, glass, plastic, metal or ceramic substrate. The substrate 202 may include integrated circuits fabricated thereon, such as driver circuits for a memory device (not shown).

The plurality of device layers 204 can be formed over the surface of the substrate 202. The plurality of device layers 204 can be deposited layers which form components of a 3D vertical NAND structure. Components which are formed by the all or part of the plurality of device layers (e.g., dielectrics, or discrete charge storage segments). The dielectric portions may be independently selected from any one or more same or different electrically insulating materials, such as silicon oxide, silicon nitride, silicon oxynitride, or other high-k insulating materials. In one embodiment, the structure can consist of silicon oxide/silicon nitride pairs deposited in an alternating fashion. The pairs can be between 100 and 600 Å in total width. The number of pairs can be greater than 10 pairs, such as 32 pairs, 64 pairs or greater. In one embodiment, the number of pairs are between 10 and 64 pairs. The total thickness can be between about 2 and about 4 microns.

The discrete charge storage segments may comprise a conductive (e.g., metal or metal alloy such as titanium, platinum, ruthenium, titanium nitride, hafnium nitride, tantalum nitride, zirconium nitride, or a metal silicide such as titanium silicide, nickel silicide, cobalt silicide, or a combination thereof) or semiconductor (e.g., polysilicon) floating gate, conductive nanoparticles, or a discrete charge storage dielectric (e.g., silicon nitride or another dielectric) feature. However, it should be understood that a dielectric charge storage feature or other floating gate material may be used instead.

The nanocrystalline diamond layer 206 is a crystalline carbon layer with a high sp3 content and a small crystal size. The most common chemical bonds in amorphous and nanocrystalline carbon are threefold (sp2 bonding) and fourfold (sp3) bonding coordination. In the sp3 configuration, a carbon atom forms four sp3 orbitals making a strong sigma bond to the adjacent atom. In carbon films with high sp3 content, the sp3 content is greater than 80%, such as greater than about 90% or greater than about 95%. The nanocrystalline diamond layer 206 shown here has a high sp3 content (e.g., nanocrystalline diamond grains) is supported by an sp2 matrix (e.g., graphite). Small crystal size is a crystal size of less than 6 nm, such as between 2 nm and 5 nm. The nanocrystalline diamond layer can have a surface roughness with a root mean square of height deviation of less than 6 nm. The nanocrystalline diamond layer can have a density of between 2.5 g/cm$^3$ and 3.5 g/cm$^3$, such as a density of 3 g/cm$^3$. The nanocrystalline diamond layer can have a stress of between −50 MPa and −150 MPa, such as a stress of between −80 MPa and −120 MPa. The nanocrystalline diamond layer can have a blanket etch selectivity of between 2 and 4 as compared to currently available diamond-like carbon films.

The device 200 comprises a channel 208. The channel 208 shown here is formed through the nanocrystalline diamond layer 206 and the plurality of device layers 204. The channel 208 can be substantially perpendicular to a first surface 210 of the substrate 202. For example, the channel 208 may have a pillar shape. The channel 208 can extend substantially perpendicularly to the first surface 210 of the substrate 202. An optional body contact electrode (not shown) may be disposed in the substrate 202 to provide body contact to a connecting portion of the channel 208 from below. In some embodiments, the channel 208 may be a filled feature. In some other embodiments, the channel 208 may be hollow. In these embodiments, an insulating fill material 212 may be formed to fill the hollow part surrounded by the channel 208. The insulating fill material 212 may comprise any electrically insulating material, such as silicon oxide, silicon nitride, silicon oxynitride, or other high-k insulating materials.

Any suitable semiconductor materials can be used for the channel 208, for example silicon, germanium, silicon germanium, or other compound semiconductor materials, such as III-V, II-VI, or conductive or semiconductive oxides, or other materials. The semiconductor material may be amorphous, polycrystalline or single crystal. The semiconductor channel material may be formed by any suitable deposition methods. For example, in one embodiment, the semiconductor channel material is deposited by low pressure chemical vapor deposition (LPCVD). In some other embodiments, the semiconductor channel material may be a recrystallized polycrystalline semiconductor material formed by recrystallizing an initially deposited amorphous semiconductor material.

Figure 3:
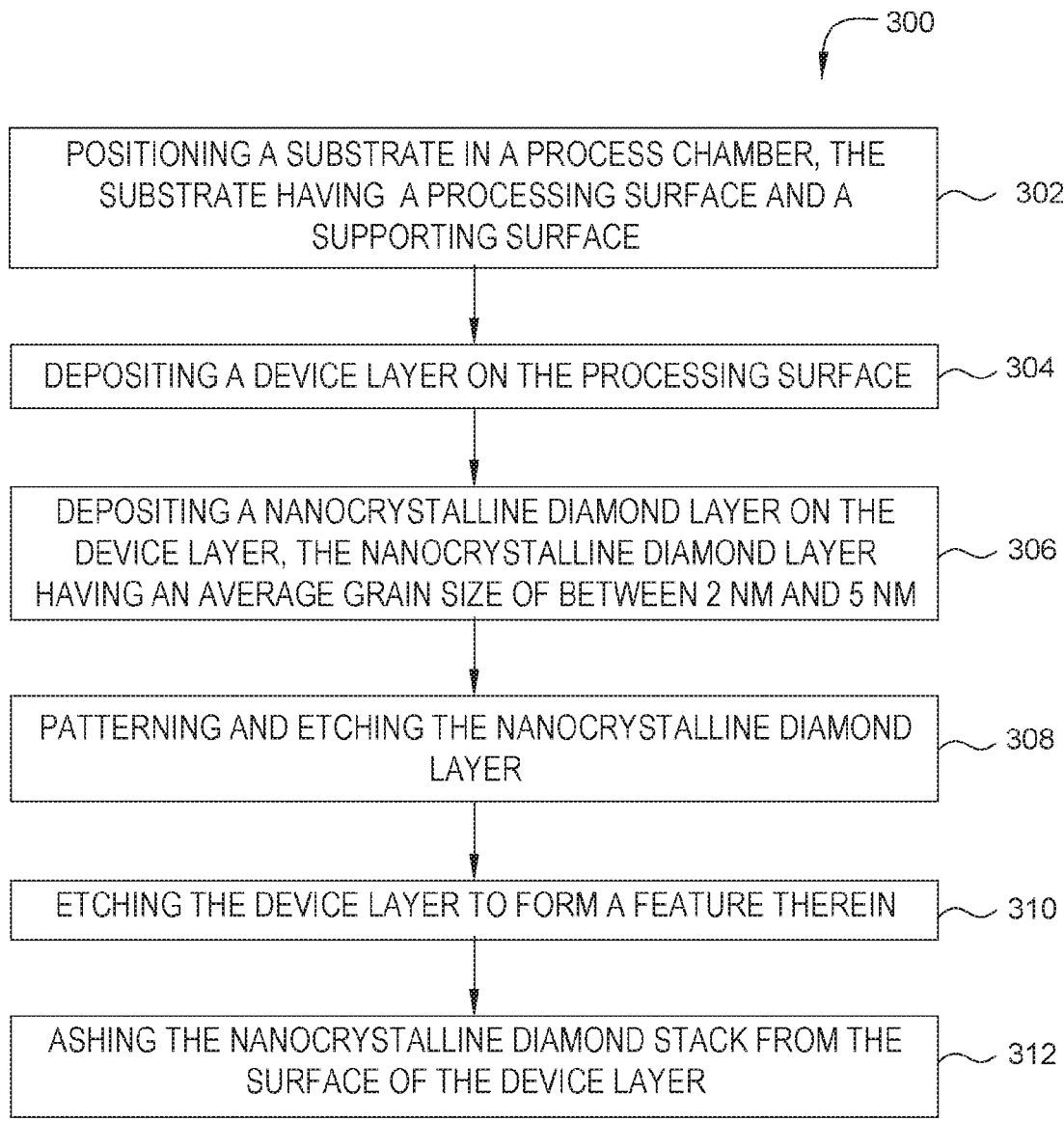
FIG. 3 is a flow diagram of a method for processing a substrate with a nanocrystalline diamond layer, according to one or more embodiments.

FIG. 3 is a flow diagram of a method 300 for processing a substrate with a nanocrystalline diamond layer, according to one or more embodiments. The etching chemistry for the device layers is substantially inert with regard to nanocrystalline diamond. As such, embodiments described herein use a hard mask comprising a nanocrystalline diamond layer, rather than a traditional hardmask. The traditional hardmask has a number of limitations which allow for the structural deficiencies described above. In one example, top critical dimension expansion is due in part to less hardmask remaining, caused by poor etch selectivity between the traditional hardmask and the underlying layers. In another example, deep contact hole deformation is due to hardmask lower density and poor thermal conductivity. Slit pattern deformation or line bending is due to HM material lower selectivity and stress. The nanocrystalline diamond layer allows for high aspect ratio features to be formed while avoiding the bowing and the bending of non-circular etching of the feature as well as avoiding pattern collapse as described above, with reference to traditional hardmasks. The nanocrystalline diamond layer achieves these benefits by having both a high physical resistivity, being chemically inert and having a high thermal conductivity. Having a high physical resistivity and being chemically inert allow for improved etch selectivity over previously known hardmasks. Improved etch selectivity allows for a good etch profile to be maintained. Further, the nanocrystalline diamond layer is much closer to diamond than standard carbon hardmasks, which gives the layer a high thermal conductivity. During an etch process, a significant amount of heat is accumulated. This heat, if it remains trapped in underlying layers, can create warping. The nanocrystalline diamond layer allows for efficient heat transfer, which prevents warp or other heat-related distortion. The nanocrystalline diamond layer can then be easily and selectively removed by ashing in the presence of an oxygen-containing gas or nitrogen-containing gas.

The method 300 begins at 302 by positioning a substrate in a process chamber, the substrate having a processing surface and a supporting surface. The substrate can be of any composition, such as a crystalline silicon substrate. The substrate can also include one or more features, such as a via or an interconnect. The substrate can be supported on a substrate support. The substrate support can be maintained in a specific temperature range. In one embodiment, the substrate support is maintained in a temperature range of between about 500 degrees Celsius and about 650 degrees Celsius.

The process chamber used with one or more embodiments can be any CVD process chamber with a remote plasma source, such as the process chamber 100 described above or chambers from other manufacturers. Flow rates and other processing parameters described below are for a 300 mm substrate. It should be understood these parameters can be adjusted based on the size of the substrate processed and the type of chamber used without diverging from the embodiments disclosed herein.

A "substrate surface", as used herein, refers to any substrate or material surface formed on a substrate upon which film processing can be performed. For example, a substrate surface on which processing can be performed includes materials such as silicon, silicon oxide, silicon nitride, doped silicon, germanium, gallium arsenide, glass, sapphire, and any other materials such as metals, metal nitrides, metal alloys, and other conductive materials, depending on the application. A substrate surface may also include dielectric materials such as silicon dioxide and carbon doped silicon oxides. Substrates may have various dimensions, such as 200 mm, 300 mm, or other diameter wafers, as well as rectangular or square panes.

A device layer can then be deposited on the processing surface, at 304. The device layer can be a device layer as described with reference to FIG. 2. Further, the device layer can be one of a plurality of device layers. The device layers can act in conjunction to form one or more features or components, such as components of a 3D NAND device.

A nanocrystalline diamond layer is then deposited on the device layer, at 306. The nanocrystalline diamond layer can have an average grain size of less than 6 nm. In one example, the nanocrystalline diamond layer has an average grain size of between 2 nm and 5 nm. A small grain size, such as below 6 nm, allows for better control of adhesion between the hardmask layer, such as the nanocrystalline diamond layer, and the underlying layer and smaller size for the hardmask layer. The random positioning of a larger grain size during deposition will increase the number of non-contact spaces between the hardmask layer and the underlying layer. The non-contact space is the space between the hardmask layer and the underlying layer where the hardmask layer is not in direct contact with the underlying layer due to shape and size of the grains of the hardmask layer and due to the roughness of the underlying layer itself. A larger non-contact space decrease the adhesion of the layer and decreases the thermal transfer between the hardmask and the underlying layer. The size of non-contact space is reduced by smaller grains, because smaller grains, when deposited as part of a layer, can be more tightly packed than larger grains. Further, due to the smaller grain size, the layer can be made thinner than larger grain size layers while maintaining good contact with the underlying layer.

Finally, the smaller grain size allows for a smaller roughness in the hardmask layer. Line width roughness (LWR), also known as line edge roughness (LER), is excessive variations in the width of the hardmask relief or feature. The roughness or variations due to LWR or LER may be disadvantageous, as the variation may be transferred onto the trenches during etch and ultimately to the circuit. The variations become more significant with a decrease in feature size of the hardmask relief. The critical dimension of the features formed from the hardmask layer can be made smaller by reducing the effect of LER or LWR. LER or LWR can be reduced by having a smaller grain size and thereby a smaller roughness.

The deposition of the nanocrystalline diamond layer can begin by delivering a deposition gas to a remote plasma chamber at a first pressure. The deposition gas includes a carbon-containing precursor and a hydrogen containing gas. In this embodiment, the carbon-containing precursor is an alkane precursor. The alkane precursor can be a saturated unbranched hydrocarbon, such as Methane, Ethane, Propane, and combinations thereof. Other alkane precursors include n-Butane, n-Pentane, n-Hexane, n-Heptane, n-Octane, and combinations thereof. The hydrogen containing gas can include $H_2$, $H_2O$, $NH_3$ or other hydrogen containing molecules. The deposition gas can further include an inert gas. The inert gas can be a noble gas, such as argon.

The deposition gas is then delivered to the remote plasma chamber. The deposition gas can either mix within the chamber or be mixed prior to entering the chamber. The deposition gas is delivered at a relatively high pressure, such as greater than 5 Torr. In one embodiment, the deposition gas is delivered at between about 10 Torr and 100 Torr, such as about 50 Torr.

The deposition gas can then be activated to create an activated deposition gas. The deposition gas can be activated by forming a plasma using a power source. Any power source capable of activating the gases into reactive species and maintaining the plasma of reactive species may be used. For example, radio frequency (RF), direct current (DC), or microwave (MW) based power discharge techniques may be used. The power source produces a source plasma power which is applied to the remote plasma chamber to generate and maintain a plasma of the deposition gas. In embodiments which use an RF power for the source plasma power, the source plasma power can be delivered at a frequency of from about 2 MHz to about 170 MHz and at a power level of between 500 W and 5000 W, for a 300 mm substrate (between 0.56 W/cm$^2$ of the top surface of the substrate and 5.56 W/cm$^2$ of the top surface of the substrate). Other embodiments include delivering the source plasma power at from about 1000 W to about 3000 W, for a 300 mm substrate (from 1.11 W/cm$^2$ of the top surface of the substrate to 3.33 W/cm$^2$ of the top surface of the substrate). The power applied can be adjusted according to size of the substrate being processed.

Based on the high pressure in the remote plasma chamber as well as other factors, ionized species formation will be minimized while radical formation is maximized. Without intending to be bound by theory, it is believed that the nanocrystalline diamond layer should be primarily sp3 bonds rather than sp2 bonds. Further, it is believed that more sp3 bonding can be achieved by increasing the number of radical species over ionized species during the deposition of the layer. Ionized species are highly energetic can need more room for movement than radicals. By increasing the pressure, electron energy is reduced while the likelihood of collision with other molecules increases. The decrease in electron energy and increase in number of collisions favors radical formation over ion formation.

Once activated, the activated deposition gas is then delivered through a second volume having a second pressure. The second volume can be a second chamber or another confined area between the process volume and the remote plasma chamber. In one example, the second volume is the connection between the remote plasma chamber and the process volume.

The second pressure is less than the first pressure. The movement from the remote plasma chamber to the second volume either based on flow rate, change in overall volume or combinations thereof results in a reduced pressure of the activated deposition gas in the second volume. The pressure is reduced to allow for better deposition from the radical species while reducing ionized species collision with the deposited layer. In one embodiment, the second pressure is between about 1 Torr and about 5 Torr.

The activated deposition gas is then delivered to a substrate in a process volume of a process chamber. The substrate can be of any composition, such as a crystalline silicon substrate. The substrate can also include one or more features, such as a via or an interconnect. The substrate can be supported on a substrate support. The substrate support can be maintained in a specific temperature range. In one embodiment, the substrate support is maintained in a temperature range of between about 500 degrees Celsius and about 650 degrees Celsius.

The substrate can be preseeded for deposition of the nanocrystalline layer. In one embodiment, the substrate is immersed or otherwise coated in a seeding solution. The seeding solution is an ethanol based nanodiamond suspension. The substrate is immersed in the suspension during an ultrasonic treatment, which adheres some of the suspended nanodiamonds to the surface of the substrate. Other preseeding techniques can be employed without diverging from the embodiments described herein.

The process chamber used with one or more embodiments can be any CVD process chamber with a remote plasma source, such as the process chamber 100 described above or chambers from other manufacturers. Flow rates and other processing parameters described below are for a 300 mm substrate. It should be understood these parameters can be adjusted based on the size of the substrate processed and the type of chamber used without diverging from the embodiments disclosed herein.

A "substrate surface", as used herein, refers to any substrate or material surface formed on a substrate upon which film processing is performed. For example, a substrate surface on which processing can be performed includes materials such as silicon, silicon oxide, silicon nitride, doped silicon, germanium, gallium arsenide, glass, sapphire, and any other materials such as metals, metal nitrides, metal alloys, and other conductive materials, depending on the application. A substrate surface may also include dielectric materials such as silicon dioxide and carbon doped silicon oxides. Substrates may have various dimensions, such as 200 mm, 300 mm or other diameter wafers, as well as rectangular or square panes.

The process volume receives the activated deposition gas at a third pressure, which is less than the second pressure. The third pressure can be a pressure less than 2 Torr, such as a pressure of between about 500 mTorr and 1 Torr.

A nanocrystalline diamond layer is then deposited on a surface of the substrate. The radicals from the previously formed activated deposition gas impinge on the substrate surface to form the nanocrystalline diamond layer. Low pressure is believed to be beneficial to the formation of sp3 bonding in the nanocrystalline diamond layer from the remotely formed radicals. The higher pressure in the remote plasma source allows for preferential radical formation while the lower pressure in the process volume allows for more uniform deposition from the previously formed radicals.

Once the nanocrystalline diamond layer is deposited, a hydrogen containing gas is delivered to the remote plasma chamber. The hydrogen containing gas can be delivered at a separate time or the gas flow from the previous step can be maintained. No alkane precursor is present for this portion. The hydrogen containing gas can be delivered with an inert gas or as part of a combination of multiple hydrogen containing gases.

The hydrogen containing gas is then activated to create an activated hydrogen containing gas. The hydrogen containing gas can be converted to a plasma using the same pressure, temperature, power type, power ranges and other parameters for formation of the plasma discussed with reference to forming the activated deposition gas.

Once the activated hydrogen containing gas is formed, it can be delivered to the substrate in the process volume. The process volume and the substrate may be maintained at the same pressure, temperature and other parameters as described above. During the deposition process, it is believed that polymers can form on the surface of the deposited nanocrystalline diamond layer. The polymers can affect further deposition and otherwise degrade performance of the deposited layer. By delivering the activated hydrogen containing gas to the deposited layer, the polymers are made volatile and can then be removed from the chamber, such that they do not affect subsequent deposition processes.

The above elements can then be repeated to deposit a nanocrystalline diamond stack of a desired thickness. Each deposition cycle produces a thickness of between about 20 Å and about 200 Å, such as about 100 Å. By repeating the above steps, the previous layer acts as a seed layer for the next deposition, allowing for an overall desired thickness to be deposited. In one embodiment, the nanocrystalline diamond stack is deposited to 1 µm thick.

The device layer can be preseeded for deposition of the nanocrystalline diamond layer. In one embodiment, the substrate is immersed or otherwise coated in a seeding solution. The seeding solution can be an ethanol based nanodiamond suspension. The substrate is immersed in the suspension during an ultrasonic treatment, which adheres some of the suspended nanodiamonds to the surface of the substrate. Other preseeding techniques can be employed without diverging from the embodiments described herein.

The nanocrystalline diamond layer can be deposited using a deposition gas. The deposition gas can include a carbon-containing precursor and a hydrogen containing gas. In this embodiment, the carbon-containing precursor can be an alkane, alkene, or alkyne precursor. The alkane precursor can be a saturated unbranched hydrocarbon, such as Methane, Ethane, Propane, and combinations thereof. Other alkane precursors include n-Butane, n-Pentane, n-Hexane, n-Heptane, n-Octane, and combinations thereof. The hydrogen containing gas can include $H_2$, $H_2O$, $NH_3$, or other hydrogen containing molecules. The deposition gas can further include an inert gas. The inert gas can be a noble gas, such as argon.

The nanocrystalline diamond layer can then be patterned and etched, at 308. Patterning can include deposition of a photoresist over the nanocrystalline diamond layer. The photoresist is then exposed to an appropriate wavelength of radiation to create a pattern. The pattern is then etched into both the photoresist and then the nanocrystalline diamond layer.

The device layer can then be etched to form a feature, at element 310. With the pattern formed in the nanocrystalline diamond layer, the device layer can then be etched. The device layer is etched by an etchant which is selective for the device layer over the nanocrystalline diamond layer. The device layer is etched using chemistry and techniques well known in the art. In one embodiment, the etchant is a chlorine containing etchant.

The nanocrystalline diamond layer can then be removed from the surface of the device layer, at element 312. The nanocrystalline diamond layer can be ashed, for example, from the surface of the device layer using a plasma ash process. The plasma ash process can include activating an oxygen-containing gas, such as $O_2$. When using $O_2$, the ash rate is about 900 A/min or greater. The nanocrystalline diamond layer may be ashed using a high aspect ratio etch system, such as Centura Avatar etch system, available from Applied Materials, Inc., located in Santa Clara, Calif.

Table 1 shows an etch selectivity comparison and accompanying film properties between an amorphous carbon hardmask (ACH) and a nanocrystalline diamond hardmask.

TABLE 1

| | Films | APF550 | NCD |
|---|---|---|---|
| Film Deposition | Dep method | CVD | MWCVD |
| | Dep rate (A/min) | 2500 | 170 |
| | Dep Temp | 550° C. | 600° C. |
| Film Property | RMS roughness (nm @5 um) | 0.46 | 7.54 |
| | Density (g/cm3) | 1.45 | 3.2 |
| | Stress (Mpa) | 50 | −207 |
| | Therm. Conductivity (W/(m * K)) | <1 | ~12 |
| Etch Performance | Blanket Etch selectivity (OP ME normalized to APF550) | 1 | 2.4 |
| | Removal (highly selective to underlayer) | O2, N2 | O2, N2 |

The films were deposited to a uniform thickness on a silicon substrate. The first film deposited was an ACH film. The ACH film was deposited using a CVD process from methane and a hydrogen-containing precursor. The deposition rate was about 2500 Å/min at a deposition temperature of 550 degrees Celsius. The RMS roughness was about 0.46. The density was 1.45 g/cm$^3$. The stress was about 50 MPa and the thermal conductivity was less than 1 W/(m*K). The blanket etch selectivity of the ACH, as normalized to standard ACH films is about 1. The ACH film can be removed by O$_2$ and N$_2$ plasma treatment.

The second film deposited was an NCD film. The NCD film was deposited using a MWCVD process from methane and a hydrogen-containing precursor. The deposition rate was about 170 Å/min at a deposition temperature of 600 degrees Celsius. The RMS roughness was about 7.54. The density was 3.2 g/cm$^3$. The stress was about −207 MPa and the thermal conductivity was about 12 W/(m*K). The blanket etch selectivity of the NCD, as normalized to standard ACH films is about 2.4. The NCD film can be removed by O$_2$ and N$_2$ plasma treatment.

The above table presents a comparison between the blanket film properties of the ACH and NCD films, such as etch rate, selectivity and stripability. As shown here, NCD film has much higher etch selectivity versus the ACH film. Further, NCD can be etched and stripped by same etch process.

While the foregoing is directed to embodiments of the methods and apparatus, other and further embodiments may be devised without departing from the basic scope thereof, and the scope thereof is determined by the claims that follow.

What is claimed is:

1. A method for etching a device layer, the method comprising:
    depositing a nanocrystalline diamond layer on a device layer, wherein the nanocrystalline diamond layer is in contact with the device layer;
    patterning and etching the nanocrystalline diamond layer;
    etching the device layer to form a channel, wherein the channel is formed in the device layer and in the nanocrystalline diamond layer; and
    removing the nanocrystalline diamond layer.

2. The method of claim 1, wherein etching the device layer comprises:
    etching an electrically insulating material.

3. The method of claim 2, wherein the device layer comprises silicon oxide, silicon nitride, silicon oxynitride, or combinations thereof.

4. The method of claim 1, wherein etching the device layer comprises:
    etching a metal or a metal alloy.

5. The method of claim 4, wherein the device layer comprises titanium, platinum, ruthenium, titanium nitride, hafnium nitride, tantalum nitride, zirconium nitride, or a metal silicide.

6. The method of claim 1, wherein the device layer comprises a semiconductor floating gate, conductive nanoparticles, or a discrete charge storage dielectric feature.

7. The method of claim 1 further comprising:
    filling the channel to form a feature, wherein with feature has an aspect ratio of greater than 50:1.

8. The method of claim 1 further comprising:
    forming a seed layer prior to depositing the nanocrystalline diamond layer.

9. A method for etching a device layer, the method comprising:
    depositing a device layer on a processing surface of a substrate, wherein the device layer is in contact with the processing surface;
    depositing a nanocrystalline diamond layer on the device layer, wherein the nanocrystalline diamond layer is in contact with the device layer, and the nanocrystalline diamond layer having an average grain size of less than 6 nm;
    forming an etch mask from the nanocrystalline diamond layer;
    etching the device layer through the etch mask to form a channel; and
    ashing the nanocrystalline diamond layer.

10. The method of claim 9 further comprising:
    filling the channel to form a feature having an aspect ratio of greater than 50:1.

11. The method of claim 9, wherein the substrate is maintained at a temperature between about 500 degrees Celsius and about 650 degrees Celsius during depositing the nanocrystalline diamond layer.

12. The method of claim 9 further comprising:
    forming a seed layer prior to depositing the nanocrystalline diamond layer.

13. A method for etching a device layer, the method comprising:
    depositing a plurality of device layers on a substrate, wherein the plurality of device layers further comprise a first device layer deposited on a processing surface of a substrate, and the first device layer is in contact with the processing surface;
    depositing a nanocrystalline diamond layer on the plurality of device layers, wherein the nanocrystalline diamond layer is in contact with the plurality of device layers;
    patterning and etching the nanocrystalline diamond layer to form an etch mask;
    etching the plurality of device layers through the etch mask to form a channel, wherein the channel is formed in the plurality of device layers and in the nanocrystalline diamond layer; and
    removing the nanocrystalline diamond layer.

14. The method of claim 13, wherein etching the plurality of device layers comprises:
    etching an electrically insulating material.

15. The method of claim 14, wherein etching the plurality of device layers comprises:
    etching silicon oxide, silicon nitride, silicon oxynitride, or combinations thereof.

16. The method of claim 13, wherein etching the plurality of device layers comprises:
    etching a metal or a metal alloy.

17. The method of claim 16, wherein etching the plurality of device layers comprises:

etching titanium, platinum, ruthenium, titanium nitride, hafnium nitride, tantalum nitride, zirconium nitride, titanium silicide, nickel silicide, cobalt silicide, or a combination thereof.

18. The method of claim 13 further comprising:

filling the channel to form a feature having an aspect ratio of greater than 50:1.

19. The method of claim 13, wherein the substrate is maintained at a temperature between about 500 degrees Celsius and about 650 degrees Celsius during depositing the nanocrystalline diamond layer.

20. The method of claim 13 further comprising:

forming a seed layer prior to depositing the nanocrystalline diamond layer.

\* \* \* \* \*